(12) United States Patent
Murasawa

(10) Patent No.: US 6,498,733 B2
(45) Date of Patent: Dec. 24, 2002

(54) ELECTRONIC DEVICE AND SHIELD

(75) Inventor: Osamu Murasawa, Tokyo (JP)

(73) Assignee: Sony Computer Entertainment Inc., Tokyo (JP)

( * ) Notice: Subject to any disclaimer, the term of this patent is extended or adjusted under 35 U.S.C. 154(b) by 0 days.

(21) Appl. No.: 09/797,421

(22) Filed: Mar. 1, 2001

(65) Prior Publication Data

US 2001/0019477 A1 Sep. 6, 2001

(30) Foreign Application Priority Data

Mar. 3, 2000 (JP) ........................................ 2000-058729

(51) Int. Cl.[7] ................................................. J05R 9/00
(52) U.S. Cl. ........................ 361/816; 361/800; 361/818; 174/35 R
(58) Field of Search .................. 361/752, 753, 361/794, 800, 816, 818, 704–710; 174/35 R, 35 GC

(56) References Cited

U.S. PATENT DOCUMENTS

| 4,464,544 A | | 8/1984 | Klein | |
|---|---|---|---|---|
| 5,019,944 A | * | 5/1991 | Ishii et al. .................. | 361/400 |
| 5,060,114 A | * | 10/1991 | Feinberg et al. ............ | 165/185 |
| 5,366,664 A | | 11/1994 | Varadan | |
| 5,880,930 A | | 3/1999 | Wheaton | |
| 5,981,043 A | * | 11/1999 | Murakami et al. .......... | 428/209 |
| 6,049,469 A | * | 4/2000 | Hood, III et al. ........... | 361/818 |
| 6,195,267 B1 | * | 2/2001 | MacDonald, Jr. et al. .. | 361/800 |
| 6,208,516 B1 | * | 3/2001 | Fangonilo et al. .......... | 165/185 |
| 6,212,073 B1 | * | 4/2001 | Yamaguchi .................. | 361/705 |
| 6,219,239 B1 | * | 4/2001 | Mellberg et al. ............ | 361/704 |
| 6,324,074 B1 | * | 11/2001 | Lunden ...................... | 361/816 |
| 6,350,951 B1 | * | 2/2002 | Askew .................. | 174/35 MS |

FOREIGN PATENT DOCUMENTS

| EP | 0 866 649 | 9/1998 |
|---|---|---|
| JP | 11-335472 | 12/1999 |
| JP | 2001-85884 | 3/2001 |
| TW | 410541 | 11/2000 |

OTHER PUBLICATIONS

U.S. patent application Ser. No. 09/658,198, Hama, filed Sep. 8, 2000.

* cited by examiner

Primary Examiner—David L. Talbott
Assistant Examiner—Tuan Dinh
(74) Attorney, Agent, or Firm—Katten Muchin Zavis Rosenman

(57) ABSTRACT

An entertainment device has a metal shielding member that covers the CPU and image processing unit and a flexible sheet that is interposed between the CPU and metal shielding member. The metal shielding member contains metal oxide magnetic particles for cutting off electromagnetic radiation generated from the CPU and image processing unit, while the flexible sheet is positioned to radiate heat away from the CPU and image processing unit.

12 Claims, 8 Drawing Sheets

ELECTRONIC DEVICE AND SHIELD

FIELD OF THE INVENTION

This invention concerns an electronic device that has a calculation processing device generally, and more particularly an electronic device that has a shield member that protects the electronic device from electromagnetic radiation emitted from the calculation processing device.

BACKGROUND OF THE INVENTION

Entertainment devices, personal computers, and other electronic devices have long had a built-in calculation processing device such as a central processing unit (CPU) for processing at high speed an enormous amount of multimedia or other information. Because the calculation processing device generates electromagnetic waves such as electromagnetic noise of many frequencies, it is important to implement on the electronic device measures against electromagnetic interference. Thus, measures against electromagnetic interference are taken by interposing an electromagnetic radiation-absorbing substance between the CPU and a heat sink, as shown in unexamined patent H11-335472 [1999], etc.

However, prior art measures against electromagnetic interference are unable to completely cut off electromagnetic radiation emitted from a CPU. In particular, faster CPU speed brings with it the desire for electronic devices that can more surely and completely cut off electromagnetic radiation. Thus, there is a need for an electronic device that can surely and completely cut off the electromagnetic radiation generated from a calculation processing device.

OBJECTS OF THE INVENTION

It is an object of the present invention, therefore, to provide an electronic device that can surely and completely cut off the electromagnetic radiation generated from a calculation processing device.

It is a further object of the present invention to provide an electronic device that has a calculation processing device covered by a metal shielding member for shielding electromagnetic interference generated by the calculation processing device.

It is a still further object of the present invention to provide an electronic device that has a calculation processing device covered by a metal shielding member and a flexible sheet interposed between the calculation processing device and shielding member, said flexible sheet containing metal oxide magnetic particles.

It is a still further object of the present invention to provide an electronic device having a calculation processing device covered by a shielding member and a heat radiating means for radiating heat away from the calculation processing device.

It is a still further object of the present invention to provide an electronic device having a flexible sheet composed by mixing silicone gel and metal oxide magnetic particles.

Still other objects and advantages of the invention will become clear upon review of the following detailed description in conjunction with the appended drawings.

SUMMARY OF THE INVENTION

An entertainment device having a calculation processing device is provided with a metal shielding member that covers the calculation processing device and prevents electromagnetic radiation generated from such calculation processing device from interfering with the entertainment device. A flexible sheet interposed between the metal shielding member and calculation processing device is provided with a heat-conductive filler that facilitates the radiation and discharge of heat away from the calculation processing device. The flexible sheet is preferably composed by mixing silicone gel and metal oxide particles, with the silicone gel providing superior heat resistance and the metal oxide particles contributing to the shielding of electromagnetic radiation. Thus, the combination of the metal shielding member and flexible sheet assures that electromagnetic radiation generated by the calculation processing device is completely cut off.

DETAILED DESCRIPTION OF THE PREFERRED EMBODIMENTS

Figure 1:
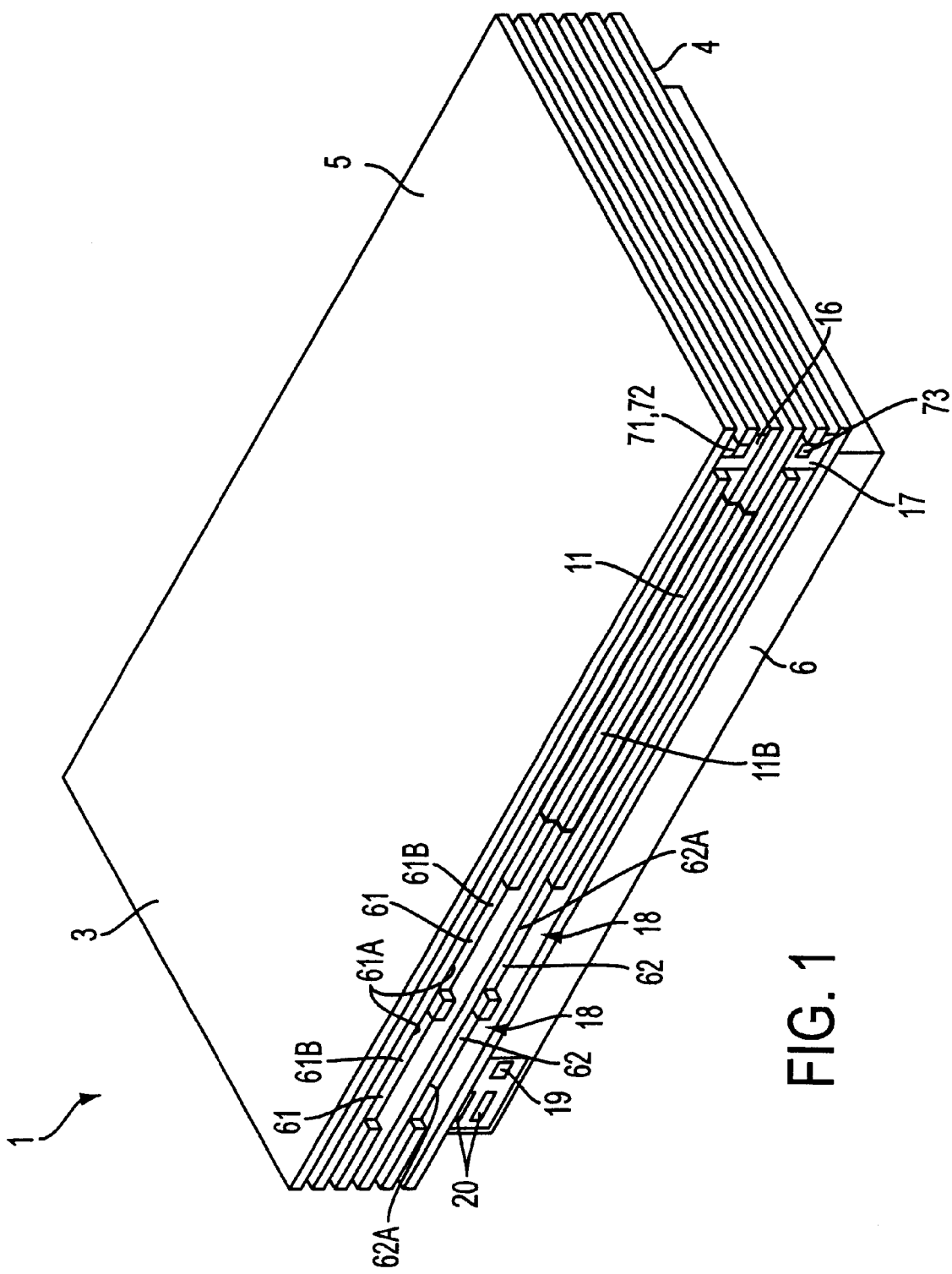
FIG. 1 is a perspective view of an electronic device of the present invention.
Figure 2:
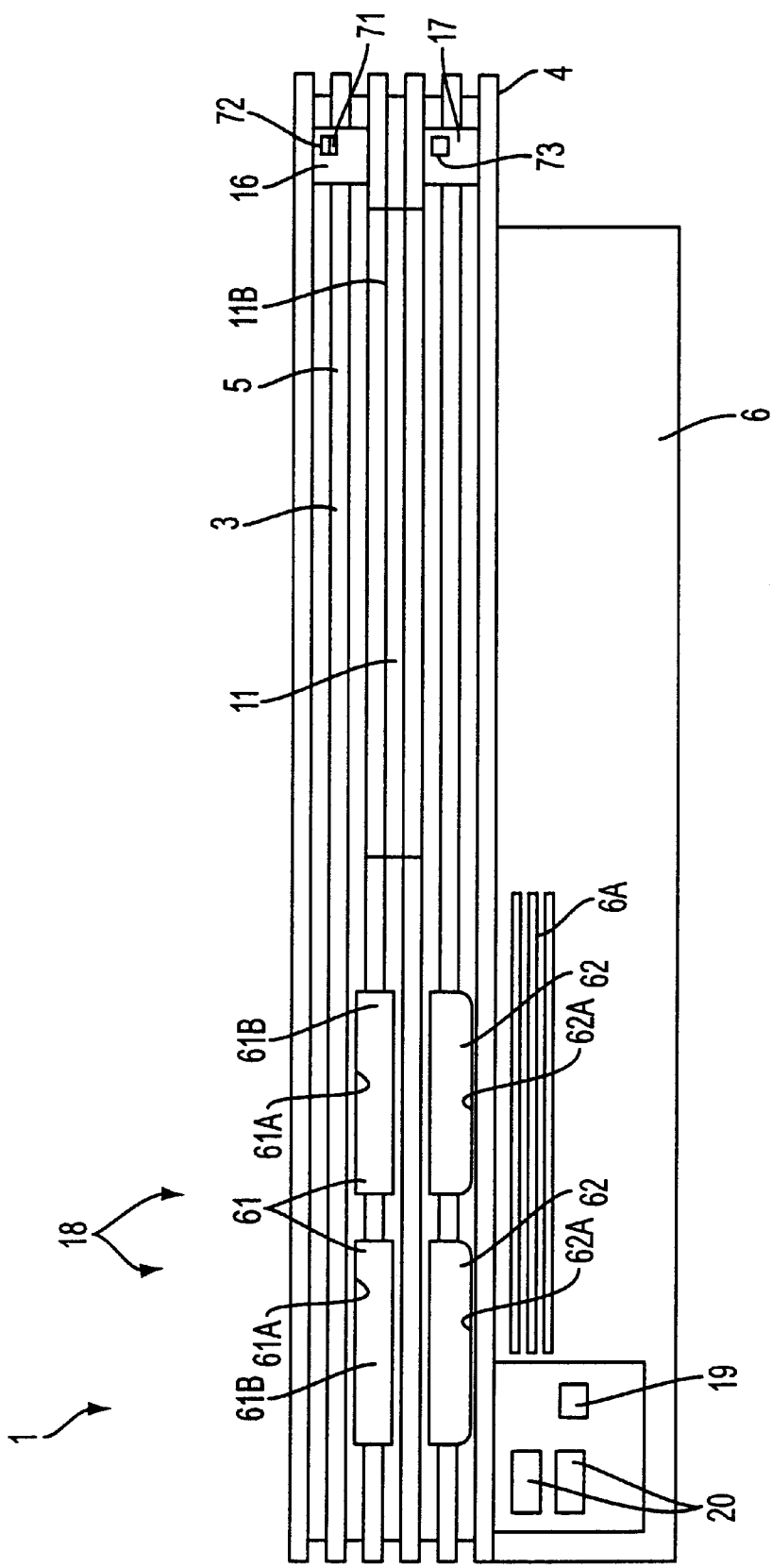
FIG. 2 is a front view of the electronic device of FIG. 1.

The following detailed description is of the best mode or modes of the invention presently contemplated. Such description is not intended to be understood in a limiting sense, but to be an example of the invention presented solely for illustration thereof, and by reference to which in connection with the following description and the accompanying drawings one skilled in the art may be advised of the advantages and construction of the invention. In the various views of the drawings, like reference characters designate like or similar parts.

FIGS. 1–5 show an electronic device 1, which is an entertainment device in accordance with an embodiment of the present invention. Entertainment device 1, for example, reads a game program, etc. recorded on an optical disk or other medium and executes it according to instructions from the users (game players). Device 1 comprises a main body 2 housed inside a cabinet 3. Cabinet 3 has center chassis 4, in which device main body 2 is provided, upper case 5 and lower case 6, and it is formed in a square shape on the plane and in roughly L shape in front. Cabinet 3 can be used in the vertical and horizontal orientation, and is further constructed asymmetrically about center chassis 4 (see FIGS. 2 and 5), with the width and depth of lower case 6 being smaller than the width and depth of upper case 5, and the volume of lower case 6 being smaller than the volume of upper case 5.

On the front right side of upper case 5 is provided disk device 11, which controls the action of a CD-ROM, DVD-ROM or the like, which has a tray 11B. On the right side of disk tray 11B are arranged, on top and bottom, power switch 16 and tray operation switch 17 for the operation of inserting disk tray 11B into and withdrawing it from upper case 5. Power switch 16 is provided with a red LED 71 and a green LED 72, which display the status of the supply of electric power to said device 1 and are unitized so that only one or the other emits light. Tray operation switch 17 is provided with a blue LED 73, which displays the operation status of disk device 11. On the front left side of upper case 5 are two slots 18, each having a memory card insertion unit 61 positioned at the top and a controller connection unit 62 positioned at the bottom. Each memory card insertion unit 61 is provided with a hole 61A that is covered by a shutter 61B for protecting the connection terminal that is provided inside, while the controller connection unit 62 is provided with an insertion hole 62A for connection to a controller. The shape of insertion hole 62A is different from the shape of insertion hole 61A, which prevents the mistaken insertion of an external auxiliary memory device into insertion hole 62A (and vice versa).

On the front left side of lower case 6 are ventilating openings 6A, data transfer terminal 19 and two external device connection terminals 20. Data transfer terminal 19 conforms to the IEEE 1394 standards and can be used to connect a digital camera, video deck or the like. The two external device connection terminals 20 conform to the USB standards and allow for connection to a keyboard, mouse or the like.

Figure 4:
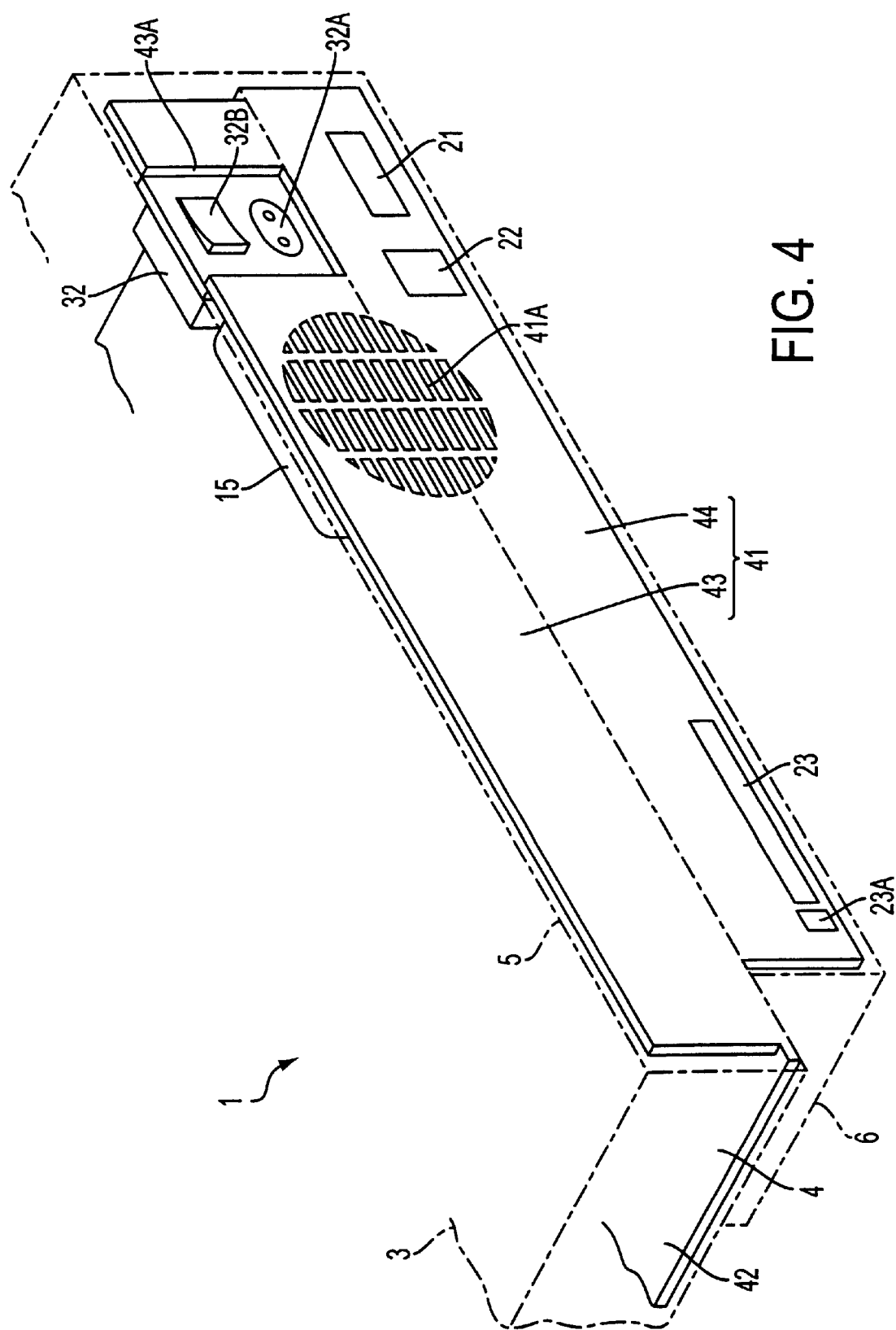
FIG. 4 is a perspective view showing the rear surface of the electronic device of FIG. 1.

As shown in FIG. 4, center chassis 4 is provided with a rear surface 41, which covers the rear surface of cabinet 3 and forms the rear surface of device 1, and board-like middle shelf 42. Rear surface 41 consists of an upper and lower rear surfaces 43 and 44 respectively, which are formed approximately in the shape of a rectangle and are long enough to block part of the upper and lower cases 5 and 6 respectively. A rectangular notch 43A formed near the right end edge of upper rear surface 43 is provided with an AC inlet 32A and a main power switch 32B. Exposed near the right end edge of lower rear surface 44, below notch 43A, is video-audio output terminal 21 for outputting video signals, audio signals and the like and optical output terminal 22, which outputs digital signals to external devices. Exposed near the left end edge of lower rear surface 44 is PCMCIA slot 23, into which are inserted various card-type peripheral devices that conform to the PCMCIA standards, which devices are removed by pressing takeout button 23A. Also, provided approximately in the center of rear surface 41 is exhaust outlet 41A, through which the air inside device 1 is expelled. Middle shelf 42 has approximately the same width and depth as upper case 5 and it is provided at right angles at the interface part of upper rear surface 43 and lower rear surface 44. A notch (not shown), for arranging exhaust fan 15 is formed in the part of middle shelf 42 that corresponds to exhaust outlet 41A.

Figure 3:
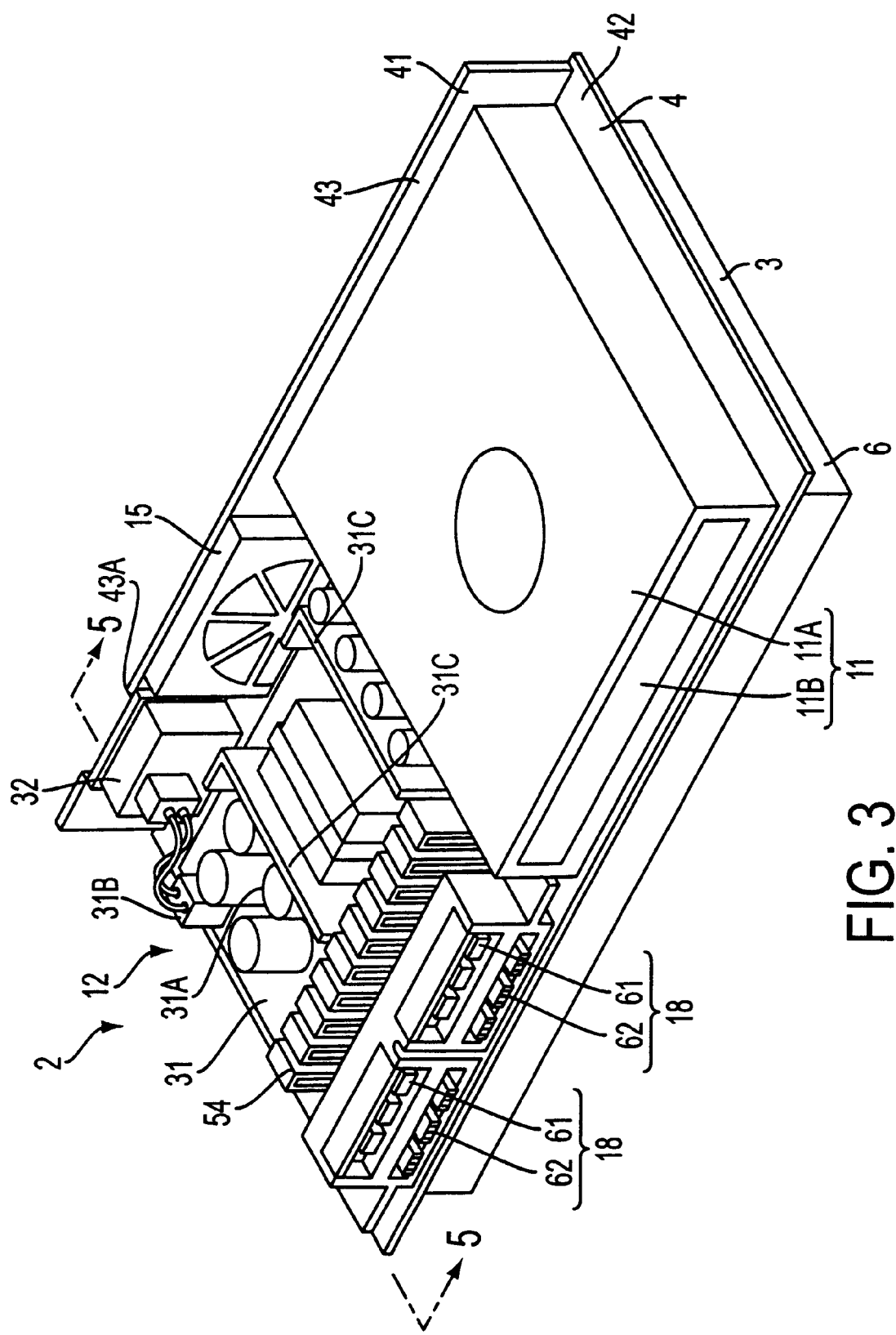
FIG. 3 is a perspective view of the interior of the electronic device of FIG. 1.
Figure 5:
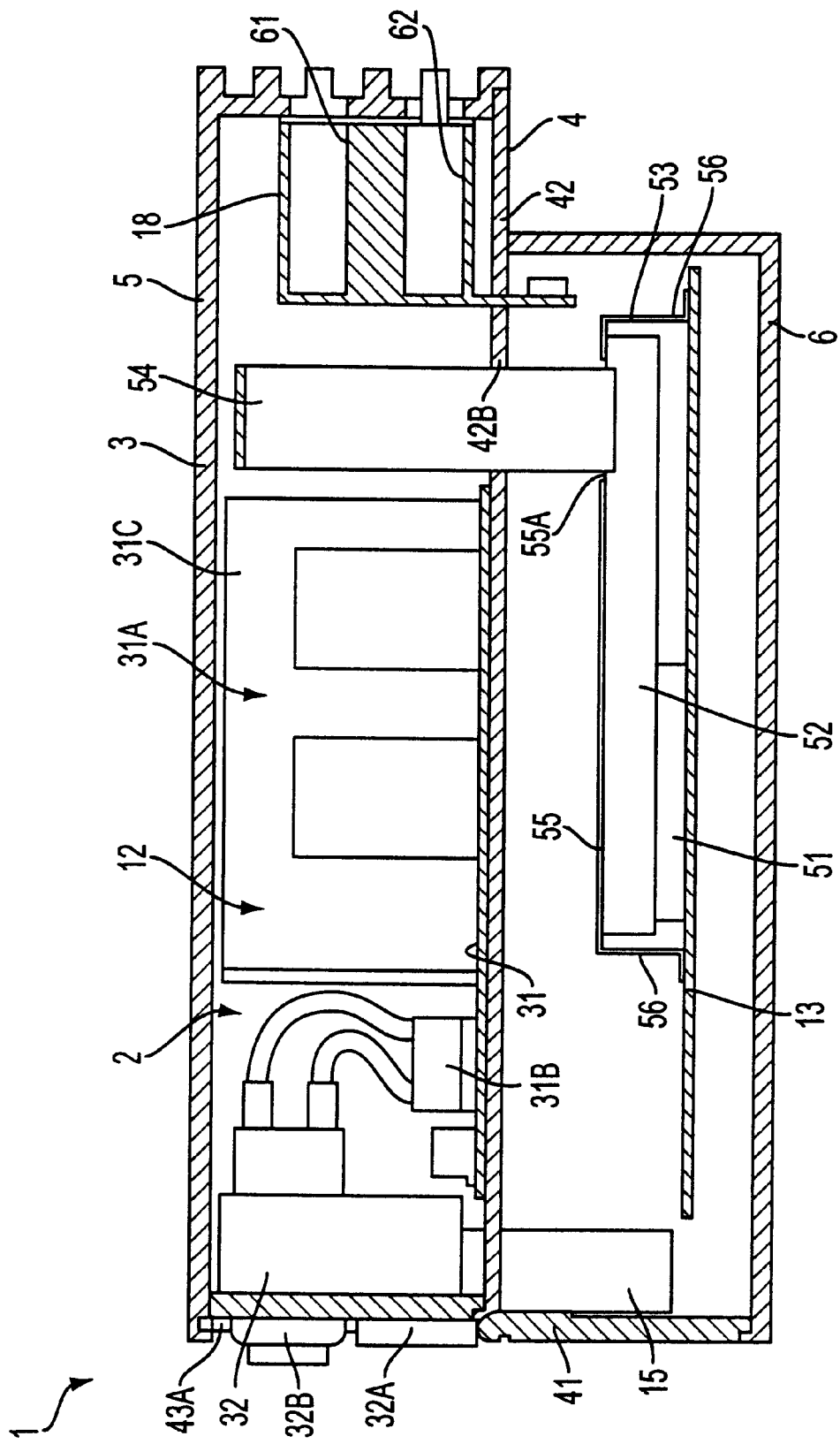
FIG. 5 is a cross section taken along line 5—5 of FIG. 3.

As shown in FIGS. 3 and 5, device main body 2 has a disk device 11, power source unit 12 and main board 13, on which a calculation processing device is mounted. Disk device 11 and power source unit 12 are arranged on middle shelf 42 of center chassis 4, and main board 13 is arranged in the space that is formed by middle shelf 42 and lower case 6. Power source unit 12 has power source circuit board 31, which is mounted on middle shelf 42, and power source unit 32, into which electric power is input from an external power source. Power source unit 32 has aforesaid AC inlet 32A and main power switch 32B, and is connected to power source circuit board 31 via connector 31B. That is, electric power from an external power source is supplied to power source circuit board 31 through AC inlet 32A by turning on main power switch 32B. Power source circuit board 31 has approximately half the plane area of middle shelf 42, and AC electric power supplied from an external power source is converted to DC electric power and the prescribed voltage by capacitors, coils, transformers, and other circuit elements 31A that make up said power source circuit board 31. An L-shaped guide plate 31C is provided on power source circuit board 31 for directing into the prescribed direction the cooling air that is brought in through openings 6A formed in lower case 6. Thus, power source unit 12 supplies to disk device 11 and main board 13, etc. the power that is obtained by power source circuit board 31.

Attached on the side of said exhaust outlet 41A is exhaust fan 15, which is also driven by the electric power from power source unit 12. Arranged on the side of exhaust outlet 41A and near openings 6A on the opposite side is below-described rectangular heat sink 54, which is a heat radiating means, and slots 18.

Main board 13 has a control system (not shown) that consists of CPU 51 and its peripheral devices, etc., a graphic system (not shown) that includes image processing unit 75, which forms output images based on signals from CPU 51, a sound system (not shown) that includes an audio processing unit that generates music and sound effects, etc., and a microprocessor unit (not shown), which is a power control means that controls the supply of electric power from power source unit 12 to said control system, graphic system, and sound system, etc. CPU 51 controls device 1 as a whole by executing (calculation-processing) the operating system. The graphic system has image processing unit 75, which renders pictures under drawing instructions from CPU 51, and a frame buffer in which images rendered by this image processing unit 75 are stored.

Heat conducting member 52, which is preferably made of high-thermal-conductivity aluminum, is provided on the upper surface of CPU 51 and image processing unit 75, straddling said CPU 51 and image processing unit 75. Provided on the upper surface of heat conducting member 52 are multiple "T"-shaped pins 52A spaced at prescribed intervals.

Figure 6:
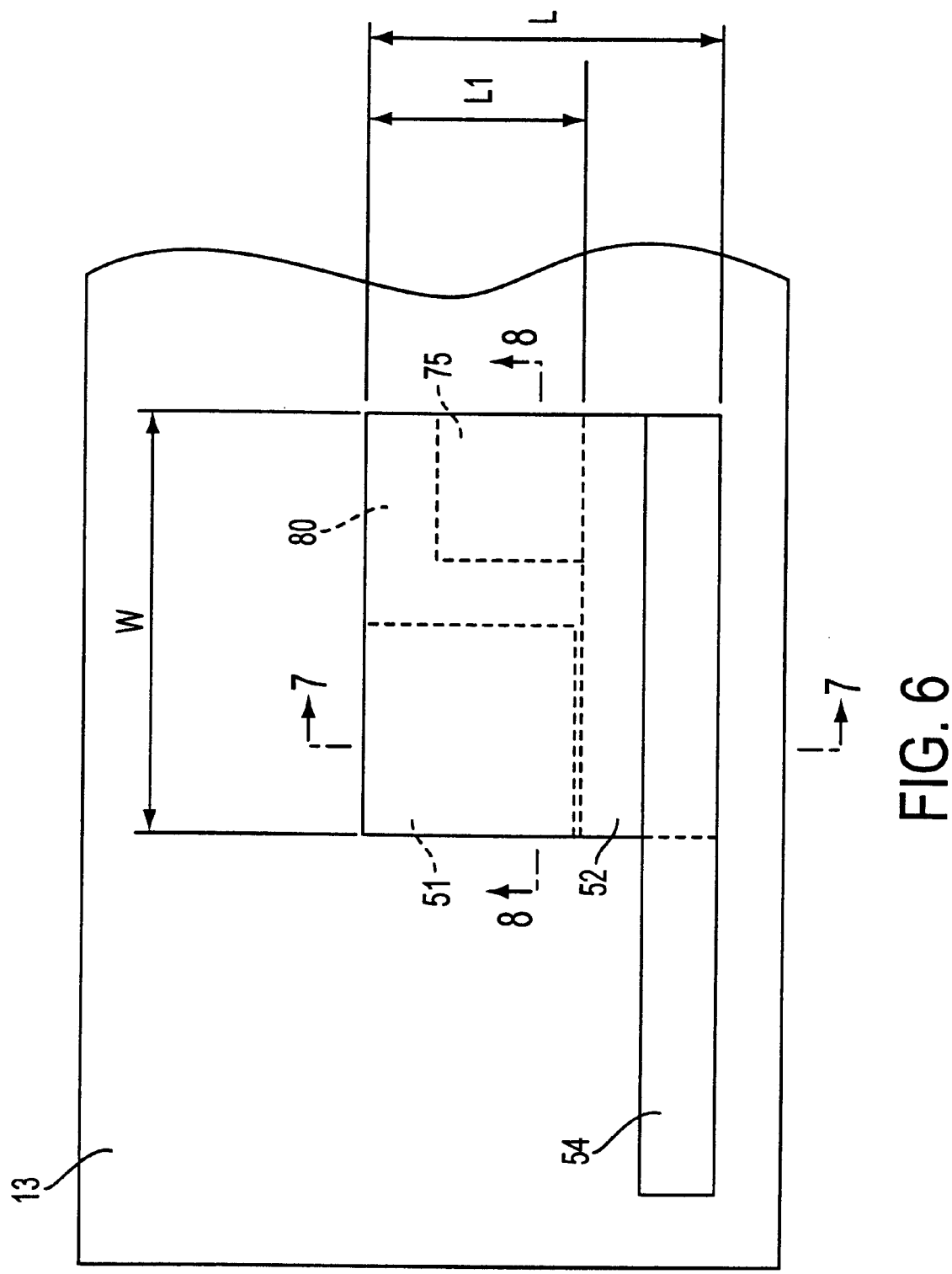
FIG. 6 simplified view showing a main board of the electronic device illustrated in FIG.1.
Figure 7:
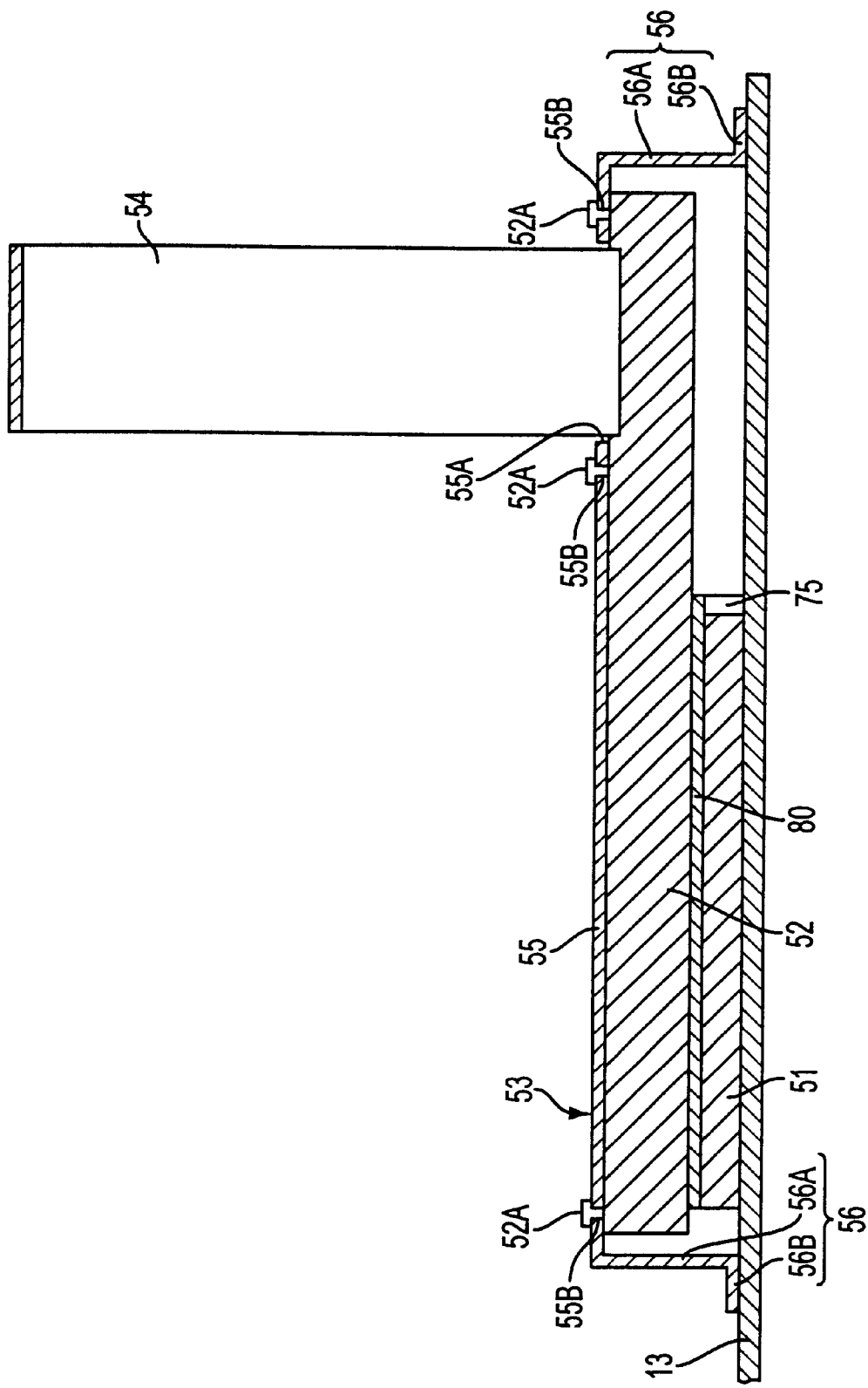
FIG. 7 is a cross section taken along line 7—7 of FIG. 6.
Figure 8:
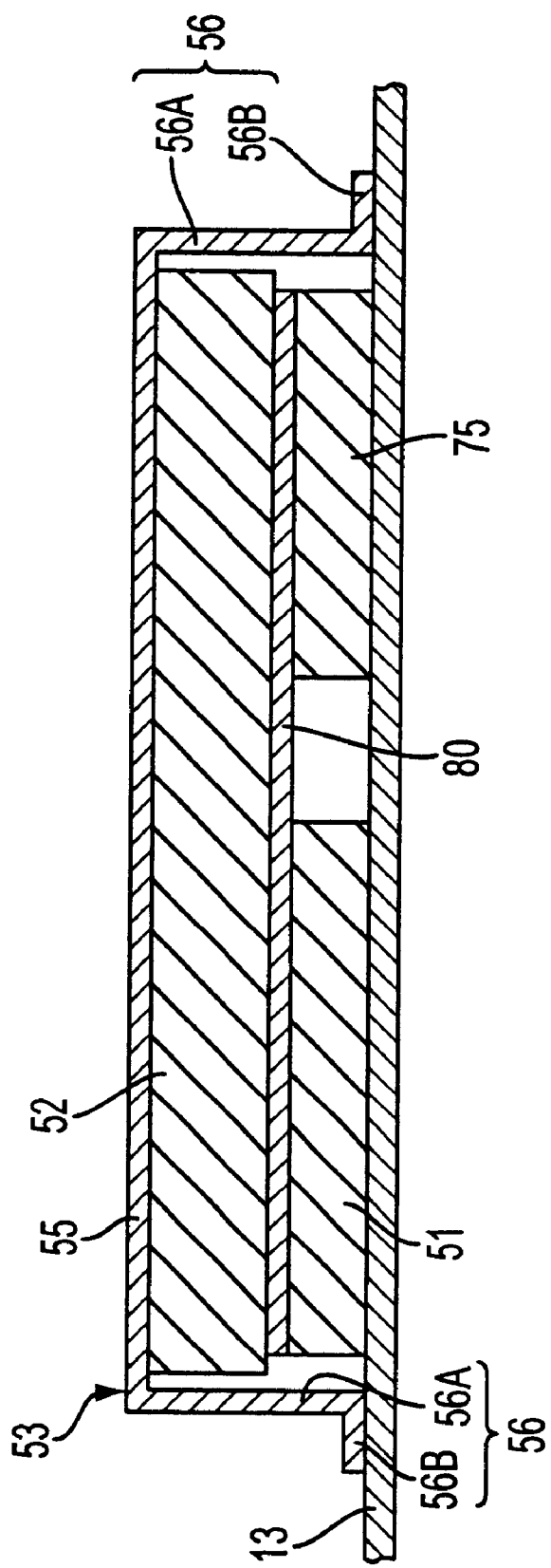
FIG. 8 is a cross section taken along line 8—8 of FIG. 6.

As shown in FIG. 6, heat conducting member 52 is formed in the shape of a rectangular board having width dimension W from one end of CPU 51 to one end of image processing unit 75 and length dimension L from the other end of CPU 51 to near one end of heat sink 54. Thus the upper surface of CPU 51 and image processing unit 75 is covered by heat conducting member 52. Interposed between heat conducting member 52 and CPU 51 and image processing unit 75 is flexible sheet 80, as shown in FIGS. 7 and 8. Flexible sheet 80 is preferably formed in rectangular board shape having dimensions so as to cover the upper surface of CPU 51 and image processing unit 75 and thus straddle said CPU 51 and image processing unit 75. The thickness of flexible sheet 80 is preferably in the range 0.2–5 mm, and more preferably approximately 1 mm.

Flexible sheet 80 preferably consists of silicone gel, metal oxide magnetic particles that absorb the electromagnetic radiation generated from CPU 51 and image processing unit 75, and a mixture with aluminum oxide, which is a metal oxide that is a heat-conducting filler that promotes heat radiation by said CPU 51 and image processing unit 75. The silicone gel preferably has a heat resistance temperature that is higher than that of other organic synthetic resins, such that said flexible sheet is able to withstand heating by the calculation processing device. In the disclosed embodiment, the metal oxide magnetic particles are Mn—Zn ferrite, and their average particle diameter is in the range 1–50 $\mu$m, although other metal oxide magnetic particles may suffice, such as Ni—Zn ferrite, a mixture of Mn—Zn and Ni—Zn or the like. Both sides of flexible sheet 80 are preferably adhesive and are provided in such a way that the sheet adheres to heat conducting member 52 and to CPU 51 and image processing unit 75, respectively, which improves the ability of flexible sheet 80 to absorb both electromagnetic radiation and heat.

CPU 51, image processing unit 75, flexible sheet 80, and heat conducting member 52 are covered by a single shielding member 53, which is preferably made of metal. It is preferable that the shielding member 53 be formed in a size that covers the calculation processing unit and image processing unit. It is also preferable that the calculation processing unit and image processing unit are divided into the parts that operate at the highest speed and produce the most heat and electromagnetic radiation among the processing units used in the electronic device, and in this way, even if multiple processing units are provided that produce much heat and electromagnetic radiation, the electronic device can thereby be manufactured more easily and with less trouble than if a shielding member were provided on each processing unit.

Shielding member 53 further comprises a flat shielding part 55, which contacts the upper surface of heat conducting member 52, and side shielding parts 56, which have an L-shaped cross-section and extend from both ends of flat shielding part 55 to the upper surface of main board 13. Holes 55B formed in flat shielding part 55 are positioned to correspond to pins 52A provided on the upper surface of heat conducting member 52. Thus, by inserting pins 52A into holes 55B and making the upper part of pins 52A protrude against the upper surface of flat shielding part 55, flat shielding part 55 is anchored onto heat conducting member 52. Side shielding part 56 has a vertical component 56A, which extends downward from the end of flat shielding part 55, and a horizontal component 56B, which extends horizontally outward from the end of vertical part 56A and whose lower surface comes into contact with the upper surface of main board 13. Through the use of flexible sheet 80 and shielding member 53, the electromagnetic radiation emitted from CPU 51 and image processing unit 75 can be surely and completely cut off, the intrusion of noise or other disturbance generated by power source unit 12, etc. into CPU 51, etc. can easily be prevented, and the stable operation of CPU 51 and image processing unit 75 can be surely maintained. In addition, flexible sheet 80 makes it possible to quickly absorb the heat generated by CPU 51 and image processing unit 75.

A temperature sensor (not shown) is preferably provided on heat conducting member 52, which sensor detects the temperature of CPU 51 and image processing unit 75. Temperature sensor has a sensor part that detects the temperature of heat conducting member 52 and a signal conversion part that converts the detected temperature into a temperature detection signal, and its output is connected to a microprocessor unit. The microprocessor unit controls the supply of power from power source unit 12 to CPU 51 and image processing unit 75 of main board 13 based on temperature abnormality detection signals from said temperature sensor.

Rectangular heat sink 54, which is one form of a heat dissipation means, is provided on the upper surface of the end of heat conducting member 52, i.e., on the outer side of shielding member 53. That is, heat sink 54 is positioned across heat conducting member 52 so as to straddle CPU 51 and image processing unit 75. Heat sink 54 extends from the upper surface of heat conducting member 52 to near the top of upper case 5. Thus, as shown in FIG. 5, openings 42B and 55A are formed in middle shelf 42 and flat shielding part 55 respectively in positions corresponding to the positioning of heat sink 54. Thus the heat generated from CPU 51 and image processing unit 75 is quickly absorbed by flexible sheet 80, is conveyed via said flexible sheet 80 and heat conducting member 52 to heat sink 54, which is positioned on the outer side of shielding member 53, and is dissipated to the outside from heat sink 54.

Through the use of the shielding member 53 and flexible sheet 80, electromagnetic radiation that is generated from CPU 51 and image processing unit 75 can be surely and completely cut off. In addition, because the flexible sheet 80 contains aluminum oxide, heat generated from CPU 51 and image processing unit 75 is quickly absorbed by said flexible sheet 80 and is dissipated to the outside of shielding member 53, thus preventing a temperature increase in the CPU 51 and image processing unit 75. Moreover, because flexible sheet 80 is arranged so as to straddle CPU 51 and image processing unit 75, the work of arranging flexible sheet 80 can be made easier than if, for example, a flexible sheet 80 were arranged separately on CPU 51 and image processing unit 75.

While the present invention has been described at some length and with some particularity with respect to the above noted embodiments, the invention is not limited to the above but includes other embodiments that can achieve the purposes of this invention, including, but not limited to modifications such as the following. For example, in the above embodiment, flexible sheet 80 is arranged so as to straddle CPU 51 and image processing unit 75. However, flexible sheet 80 may be formed in sizes for, and arranged separately on, CPU 51 and image processing unit 75, and this may be suitably determined according to the implementation. Also, while shielding member 53 is preferably formed in a size sufficient to cover CPU 51 and image processing unit 75, it may be formed in sizes sufficient to cover CPU 51 and image processing unit 75 separately. In addition, while flexible sheet 80 preferably contains aluminum oxide, it may contain a metal oxide such as magnesium oxide, zinc oxide, titanium oxide, aluminum nitride, boron nitride, silicon nitride, or silicon carbide, etc., or it may not contain these as long as there is another medium that promotes the dissipation of heat from CPU 51 and image processing unit 75.

While the present invention has been described at some length and with some particularity with respect to the several described embodiments, it is not intended that it should be limited to any such particulars or embodiments or any particular embodiment, but it is to be construed with references to the appended claims so as to provide the broadest possible interpretation of such claims in view of the prior art and, therefore, to effectively encompass the intended scope of the invention.

I claim:

1. An electronic device comprising:
   a) a main board,
   b) a calculation processing device that generates electromagnetic radiation and is disposed on said main board,
   c) a shielding member disposed around said calculation processing device and containing said calculation processing device within a defined area bounded by said shielding member and said main board and a heat-radiating means disposed on the outside of said shielding member, which heat-radiating means radiates heat generated by said calculation processing device away from said defined area,
   d) a heat conducting member disposed between said calculation processing device and said shielding member, e) a flexible sheet containing metal oxide particles and interposed between said calculation processing device and said heat conducting member, f) wherein said shielding member and said flexible sheet prevent electromagnetic radiation generated by said calculation processing device from escaping outside said defined area.

2. An electronic device in accordance with claim 1, wherein said shielding member is metal and said flexible sheet further comprises a heat-conductive material.

3. An electronic device in accordance with claim 1, wherein said beat-radiating means is connected to said heat conducting member.

4. An electronic device in accordance with claim 1, wherein said calculation processing device further comprises a calculation processing unit and an image processing unit and said shielding member is dimensioned to cover said calculation processing unit and said image processing unit.

5. An electronic device in accordance with claim 1, wherein said metal oxide magnetic particles is selected from Mn—Zn ferrite, Ni—Zn ferrite or a mixture of the two.

6. An electronic device in accordance with claim 1, wherein said metal oxide magnetic particles have an average particle diameter in the range of 1–50 $\mu$m.

7. An electronic device in accordance with claim 2, wherein said flexible sheet is adhesively connected to said heat conducting member and said calculation processing device.

8. An electronic device in accordance with claim 2, wherein said flexible sheet further comprises a mixture of silicone gel and metal oxide magnetic particles.

9. An electronic device in accordance with claim 4, wherein said flexible sheet is positioned to straddle said calculation processing unit and said image processing unit.

10. An electronic device in accordance with claim 5, wherein said metal oxide magnetic particles have an average particle diameter in the range of 1–50 $\mu$m.

11. An electronic device in accordance with claim 8, wherein said metal oxide magnetic particles is selected from Mn—Zn ferrite, Ni—Zn ferrite or a mixture of the two.

12. An electronic device comprising:

a calculation processing device that generates electromagnetic radiation, b) a shielding member disposed around said calculation processing device, c) a flexible sheet interposed between said calculation processing device and said shielding member, said shielding member and said flexible sheet containing electromagnetic radiation generated by said calculation processing device within said defined area, d) a heat conductive member disposed between said flexible sheet and said shield member, and e) a heat radiating means connected to said heat conductive member and extending through said shielding member.

* * * * *